United States Patent
Shinoda

(10) Patent No.: US 10,991,434 B2
(45) Date of Patent: Apr. 27, 2021

(54) SERIAL INTERFACE CIRCUIT, SEMICONDUCTOR DEVICE AND SERIAL-PARALLEL CONVERSION METHOD

(71) Applicant: LAPIS SEMICONDUCTOR CO., LTD, Yokohama (JP)

(72) Inventor: Tatsuru Shinoda, Yokohama (JP)

(73) Assignee: LAPIS Semiconductor Co., Ltd., Yokohama (JP)

(*) Notice: Subject to any disclaimer, the term of this patent is extended or adjusted under 35 U.S.C. 154(b) by 137 days.

(21) Appl. No.: 16/283,848

(22) Filed: Feb. 25, 2019

(65) Prior Publication Data

US 2019/0267101 A1 Aug. 29, 2019

(30) Foreign Application Priority Data

Feb. 28, 2018 (JP) .............................. JP2018-034204

(51) Int. Cl.
*G11C 7/00* (2006.01)
*G11C 16/26* (2006.01)
*G11C 16/24* (2006.01)
*G11C 11/34* (2006.01)
*G11C 7/10* (2006.01)

(Continued)

(52) U.S. Cl.
CPC .............. *G11C 16/26* (2013.01); *G11C 7/106* (2013.01); *G11C 7/1057* (2013.01); *G11C 7/1087* (2013.01); *G11C 8/06* (2013.01); *G11C 11/34* (2013.01); *G11C 16/24* (2013.01); *G11C 16/32* (2013.01); *G11C 7/1084* (2013.01); *G11C 2207/107* (2013.01)

(58) Field of Classification Search
CPC ..................................................... G06F 3/0679
USPC ......................................................... 711/100
See application file for complete search history.

(56) References Cited

U.S. PATENT DOCUMENTS

| | | | | |
|---|---|---|---|---|
| 5,835,936 A | * | 11/1998 | Tomioka | ............ G11C 16/0408 711/103 |
| 2007/0153576 A1 | * | 7/2007 | Oh | ......................... G11C 16/10 365/185.11 |

(Continued)

FOREIGN PATENT DOCUMENTS

JP 2004265283 9/2004

*Primary Examiner* — Min Huang
(74) *Attorney, Agent, or Firm* — JCIPRNET

(57) ABSTRACT

A serial interface circuit, a semiconductor device, and a serial-parallel conversion method are provided. The disclosure is to generate first to $n^{th}$ timing signals respectively indicating timings that differ by 1 bit cycle of the bit string when receiving a serial signal including the bit string in a serial form and converting the bit string into a parallel form to obtain a parallel bit group. Each bit in the bit string is held at the timings of the first to $t^{th}$ timing signals as the standby bit group, the standby bit group is acquired at the timing of any one of the $(t+1)^{th}$ to $n^{th}$ timing signals as a part of the parallel bit group, and each bit in the bit string is held at the timings of the $(t+1)^{th}$ to $n^{th}$ timing signals and the held bit group is set as another part of the parallel bit group.

6 Claims, 5 Drawing Sheets

(51) Int. Cl.
  *G11C 16/32* (2006.01)
  *G11C 8/06* (2006.01)

(56) References Cited

U.S. PATENT DOCUMENTS

| | | | |
|---|---|---|---|
| 2009/0161451 A1* | 6/2009 | Kim | G11C 5/143 |
| | | | 365/191 |
| 2013/0054879 A1* | 2/2013 | Sun | G06F 12/02 |
| | | | 711/103 |
| 2014/0029331 A1* | 1/2014 | Gopalakrishnan | |
| | | | G11C 11/4063 |
| | | | 365/149 |
| 2014/0289448 A1* | 9/2014 | Koudele | G11C 7/1069 |
| | | | 711/103 |
| 2019/0042087 A1* | 2/2019 | Zhu | G06F 13/1694 |

* cited by examiner

SERIAL INTERFACE CIRCUIT, SEMICONDUCTOR DEVICE AND SERIAL-PARALLEL CONVERSION METHOD

CROSS-REFERENCE TO RELATED APPLICATION

This application claims the benefit of Japan Application No. 2018-034204, filed on Feb. 28, 2018. The entirety of the above-mentioned patent application is hereby incorporated by reference herein and made a part of this specification.

BACKGROUND

Technical Field

The disclosure relates to a semiconductor device and particularly relates to a semiconductor device, which includes a semiconductor memory having a serial interface circuit, and a serial-parallel conversion method.

Description of Related Art

In recent years, as the memories mounted on electronic devices such as portable terminals, memories having a serial interface (hereinafter referred to as SPI memory) have become widespread.

As such a SPI memory, there is a memory provided with a DI (digital input) port for receiving write commands or read commands, addresses, and data for writing in a serial form, and a Do (digital output) port for outputting the serial data read from the memory (for example, refer to Japanese Laid-Open No. 2004-265283 (Patent Document 1)).

FIG. 1 is a diagram showing an example of the signal format received by the SPI memory described in Patent Document 1 during write access and read access.

In the write access shown in FIG. 1, in the state where the chip select signal Cs is at logic level 0 which selects the SPI memory as the operating device, the write command, the write address, and the write data are acquired in order from the DI port in synchronization with the serial clock signal SK in the 1 bit serial form. These write command, write address, and write data are individually converted into a parallel form via the serial interface circuit. Then, the write processing for writing the write data, which has been converted into the parallel form, to the area specified by the write address, which has been converted into the parallel form, is started.

Moreover, in the read access, in the state where the chip select signal Cs is at logic level 0, the read command, the read address, and the dummy data are acquired in order from the DI port in synchronization with the serial clock signal SK in the 1 bit serial form. These read command and read address are individually converted into a parallel form via the serial interface circuit. Then, the data written to the area specified by the read address, which has been converted into the parallel form, is outputted from the Do port as read data.

Here, in the SPI memory described in Patent Document 1, in order to consecutively perform the read access subsequent to the write access, the processing is shifted to the read access after the write processing for writing the write data to the area specified by the write address is started.

However, when consecutively performing the read access subsequent to the write access, for example, if the time required for acquiring the read command shown in FIG. 1 is short or the time required for the write processing is long, there is concern that the read address may be acquired during execution of the write processing. In that case, the address specifying the writing destination area may be switched from the write address to the read address while the write data is being written, resulting in problems such as erroneous writing.

In order to avoid such problems, it is necessary to provide an interval period, which includes the time required for the write processing, in the period of shifting from the write access to the read access. For this reason, the timing at which the read access is started is delayed by the time required for the write processing, which causes the problem that the whole processing time is increased.

Thus, the disclosure provides a serial interface circuit, a semiconductor device, and a serial-parallel conversion method for quickly shifting from the write access to the read access in a memory having a serial interface.

SUMMARY

A serial interface circuit according to the disclosure receives a serial signal, which includes a bit string in a serial form, and converts the bit string included in the serial signal into a parallel form to obtain a parallel bit group. The serial interface circuit includes: a timing signal generation part generating first to $n^{th}$ (n is an integer equal to or greater than 2) timing signals respectively indicating timings that differ by 1 bit cycle of the bit string; a first conversion part holding each bit in the bit string included in the serial signal at timings of the first to $t^{th}$ (t is an integer less than n) timing signals among the first to $n^{th}$ timing signals and outputting a held bit group as a standby bit group; a standby output part acquiring the standby bit group at a timing of any one of $(t+1)^{th}$ to $n^{th}$ timing signals among the first to $n^{th}$ timing signals and outputting the acquired standby bit group as a part of the parallel bit group; and a second conversion part holding each bit in the bit string included in the serial signal at timings of the $(t+1)^{th}$ to $n^{th}$ timing signals and outputting a held bit group as another part of the parallel bit group.

Further, a semiconductor device according to the disclosure includes: a memory cell array including a plurality of memory cells; an address serial-parallel conversion part receiving a serial signal, which includes a bit string of an address in a serial form, and converting the bit string of the address included in the serial signal into a parallel form to obtain a memory address; and a decoder supplying a drive voltage to the memory cell specified by the memory address. The address serial-parallel conversion part includes: a timing signal generation part generating first to $n^{th}$ (n is an integer equal to or greater than 2) timing signals respectively indicating timings that differ by 1 bit cycle of the bit string; a first conversion part holding each bit in the bit string included in the serial signal at timings of the first to $t^{th}$ (t is an integer less than n) timing signals among the first to $n^{th}$ timing signals and outputting a held bit group as a standby address bit group; a standby output part acquiring the standby address bit group at a timing of any one of $(t+1)^{th}$ to $n^{th}$ timing signals among the first to $n^{th}$ timing signals and outputting the acquired standby address bit group as a part of the memory address; and a second conversion part holding each bit in the bit string included in the serial signal at timings of the $(t+1)^{th}$ to $n^{th}$ timing signals and outputting a held bit group as another part of the memory address.

Further, a serial-parallel conversion method according to the disclosure is for receiving a serial signal, which includes a bit string in a serial form, and converting the bit string included in the serial signal into a parallel form to obtain a parallel bit group. The serial-parallel conversion method includes: generating first to $n^{th}$ (n is an integer equal to or greater than 2) timing signals respectively indicating timings that differ by 1 bit cycle of the bit string; holding each bit in the bit string included in the serial signal at timings of the first to $t^{th}$ (t is an integer less than n) timing signals among the first to $n^{th}$ timing signals and outputting a held bit group as a standby bit group; acquiring the standby bit group at a timing of any one of $(t+1)^{th}$ to $n^{th}$ timing signals among the first to $n^{th}$ timing signals and outputting the acquired standby bit group as a part of the parallel bit group; and holding each bit in the bit string included in the serial signal at timings of the $(t+1)^{th}$ to $n^{th}$ timing signals and outputting a held bit group as another part of the parallel bit group.

DESCRIPTION OF THE EMBODIMENTS

By adopting the serial interface circuit according to the disclosure, it is possible to receive the read address in the form of a serial signal in the write processing period without waiting for the write processing period in the write access to end when shifting from the write access to the read access. Therefore, it is possible to shift from the write access to the read access quickly as compared with the case of waiting for the write processing period to end and then receiving the read address.

Embodiments of the disclosure will be described in detail below with reference to the drawings.

Figure 1:
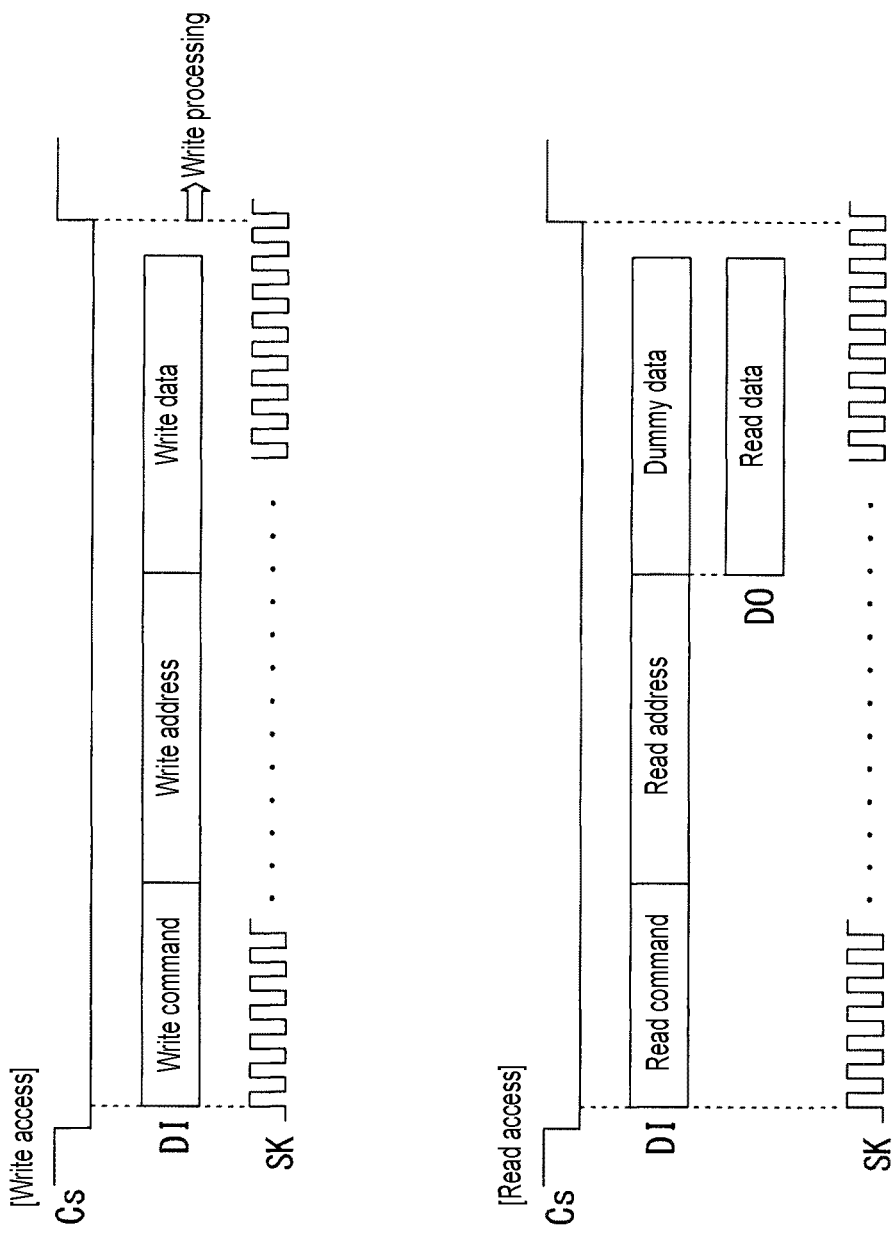
FIG. 1 is a diagram showing the signal format received by a SPI memory during write access and read access.
Figure 2:
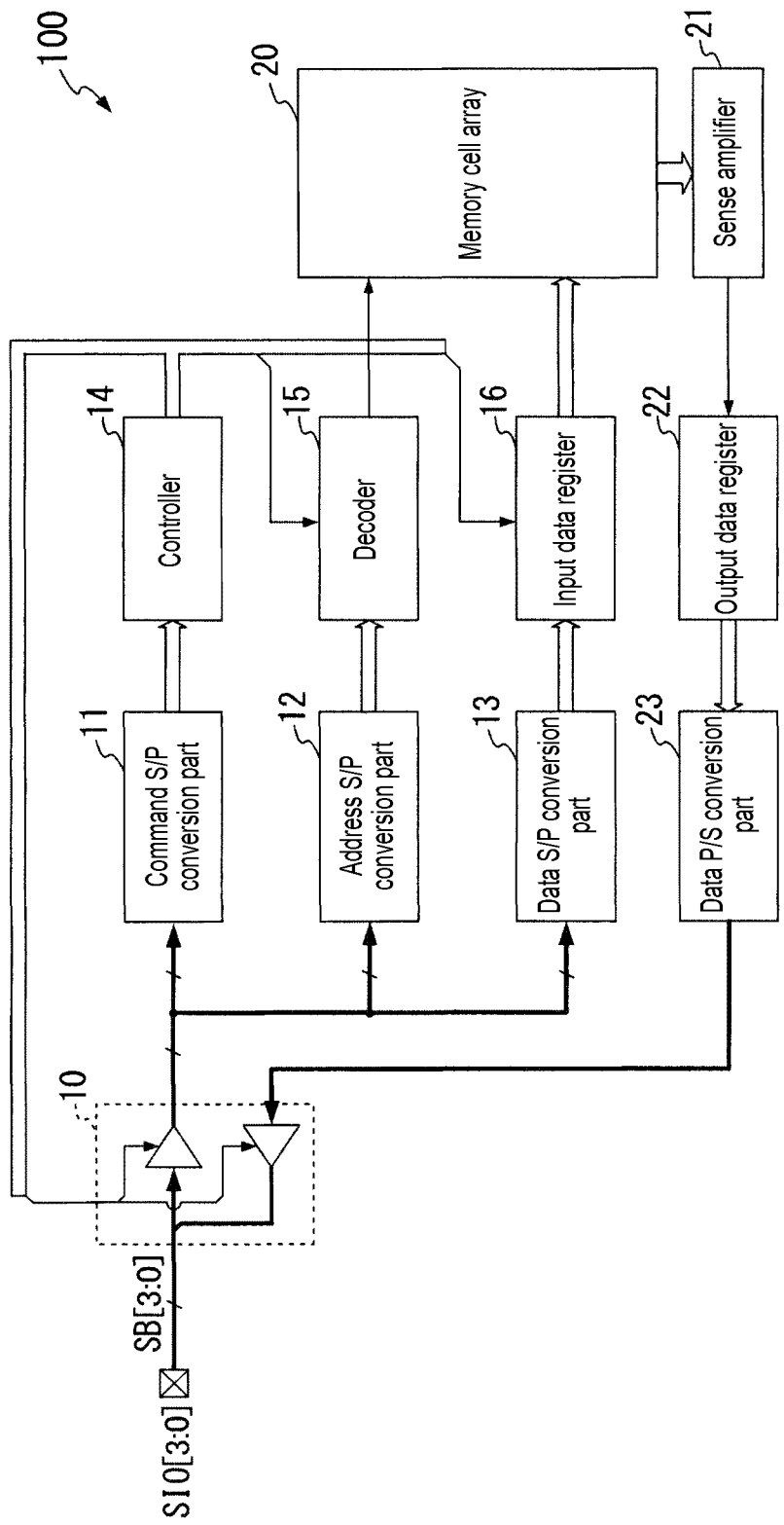
FIG. 2 is a block diagram showing a configuration of the semiconductor memory 100.

FIG. 2 is a block diagram showing a configuration of a semiconductor memory 100 included in a semiconductor device.

The semiconductor memory 100 conforms to the Quad SPI (Serial Peripheral Interface) standard, for example, and receives write access and read access by four serial signals. The semiconductor memory 100 has a data capacity of 4 Mbit, for example, and has a memory cell array 20 that receives write access and read access based on a 19-bit address and includes a plurality of memory cells.

In FIG. 2, an input/output buffer part 10 receives each of various (write and read) commands, addresses, or data by four serial signals SB[0] to SB[3] via four input/output terminals SIO[0] to SIO[3]. In the following description, SIO[0] to SIO[3] are collectively described as SIO[3: 0], and SB[3] to SB[0] are collectively described as SB[3: 0].

The input/output buffer part 10 supplies the serial signals SB[3: 0] to a command S/P (Serial/Parallel) conversion circuit 11, an address S/P conversion circuit 12, and a data S/P conversion circuit 13 that serve as serial interface circuits.

Figure 3:
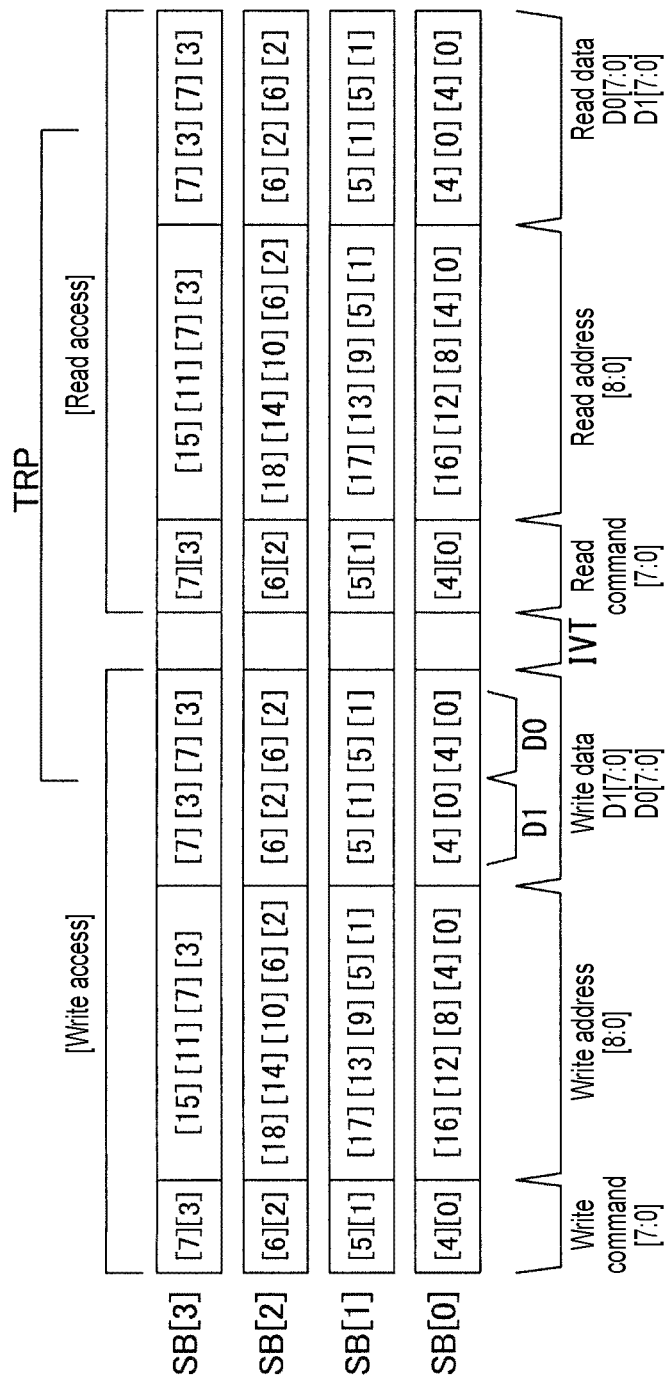
FIG. 3 is a diagram showing an example of the format of the serial signal SB[3: 0] received by the semiconductor memory 100 during write access and read access.

FIG. 3 is a diagram showing an example of the format of the serial signals SB[3: 0] received via the input/output terminals SIO[3: 0] during write access and read access of the semiconductor memory 100.

For example, during the write access shown in FIG. 3, first, the input/output buffer part 10 receives a 8-bit write command [7: 0] in the form of the following serial signals SB[3: 0].

In other words, the input/output buffer part 10 receives the serial signal SB[3] indicating the bits [7] and [3] in the write command [7: 0] in order, the serial signal SB[2] indicating the bits [6] and [2] in order, the serial signal SB[1] indicating the bits [5] and [1] in order, and the serial signal SB[0] indicating the bits [4] and [0] in order.

Next, the input/output buffer part 10 receives the 19-bit write address bits [18: 0] in the form of the following four-system serial signals SB[3: 0].

In other words, the input/output buffer part 10 receives the serial signal SB[3] indicating the bit string of the bits [15], [11], [7], and [3] in the write address bits [18: 0] in order and the serial signal SB[2] indicating the bit string of the bits [18], [14], [10], [6], and [2] in order. The input/output buffer part 10 further receives the serial signal SB[1] indicating the bit string of the bits [17], [13], [9], [5], and [1] in the write address bits [18: 0] in order and the serial signal SB[0] indicating the bit string of the bits [16], [12], [8], [4], and [0] in order.

Hereinafter, similarly, two pieces of write data D0[7: 0] and D1[7: 0] each comprising 8 bits are received in the form of the serial signals SB[3: 0] as shown in FIG. 3.

The command S/P conversion part 11 acquires only the 8 bits [7: 0] corresponding to the write command or read command shown in FIG. 3 from the serial signals SB[3: 0] and converts them into the 8-bit parallel form. The command S/P conversion part 11 supplies the write command or read command that have been converted into the parallel form to a controller 14.

When receiving the write command, the controller 14 generates various control or timing signals for writing data in the memory cell array 20. In addition, when receiving the read command, the controller 14 generates various control or timing signals for reading data from the memory cell array 20. Further, the controller 14 generates an input/output control signal for controlling the input/output state of the input/output buffer part 10, and various timing signals indicating the timings when a voltage for writing or a voltage for reading is supplied to the memory cell array 20.

The address S/P conversion part 12 acquires only the 19 bits [18: 0] corresponding to the write address or read address shown in FIG. 3 from the serial signals SB[3: 0] and converts them into the 19-bit parallel form. The address S/P conversion part 12 supplies a memory address (write address or read address) of the 19 bits [18: 0] converted into the parallel form to a decoder 15. The decoder 15 generates a selection voltage for accessing the memory cell included in the area of the memory cell array 20 specified by the memory address, and a drive voltage such as a write voltage for data writing or a read voltage for data reading. The decoder 15 supplies the generated drive voltage to the memory cell array 20 at the timing of the timing signal supplied from the controller 14.

The data S/P conversion part 13 acquires the 16 bits corresponding to the write data shown in FIG. 3 from the serial signals SB[3: 0] and respectively converts them into the write data D1[7: 0] and D0[7: 0] in the 8-bit parallel form. The data S/P conversion part 13 supplies the write data D1[7: 0] and D0[7: 0] converted into the parallel form to an input data register 16. The input data register 16 acquires the write data D1[7: 0] and D0[7: 0] and supplies them to the memory cell array 20 at the timing of the timing signal supplied from the controller 14.

In the memory cell array 20, charges corresponding to the above-described write data are accumulated in the memory cell that receives supply of the above-described selection voltage and is supplied with the writing voltage. In addition, the memory cell that receives supply of the above-described selection voltage and is supplied with the reading voltage causes a read current corresponding to the charges accumulated therein to flow to a bit line (not shown).

A sense amplifier 21 amplifies the potential of the bit line so as to determine the value of the read data for each bit and supply the read data having the data value to an output data register 22.

The output data register 22 acquires the read data and holds it, and supplies the 8-bit read data D1[7: 0] and D0[7: 0] shown in FIG. 3, for example, to a data P/S (Parallel/Serial) conversion part 23.

The data P/S (Parallel/Serial) conversion part 23 converts the read data D1[7: 0] and D0[7: 0] into the 1-bit serial form and supplies the serial signals SB[3: 0] obtained by dividing the read data into four as shown in FIG. 3 to the input/output buffer part 10. Thus, the input/output buffer part 10 outputs read data of 16 bits comprising the read data D1[7: 0] and D0[7: 0] in the form of the four-system serial signals SB[3: 0] shown in FIG. 3 via the input/output terminals SIO[3: 0].

With the above configuration, the semiconductor memory 100 acquires the write commands [7: 0], the write address bits [18: 0], and the write data D1[7: 0] and D0[7: 0] in order in the form of the serial signals SB[3: 0] as shown in FIG. 3 during write access. Thus, the semiconductor memory 100 writes the write data D1[7: 0] and D0[7: 0] in order to the memory cell array 20 with the address specified by the write address bits [18: 0] as the writing start address.

In addition, the semiconductor memory 100 acquires the read command [7: 0], the read address bits [18: 0], and the dummy data in order in the form of the serial signals SB[3: 0] as shown in FIG. 3 during read access. Thus, the semiconductor memory 100 reads the data D1[7: 0] and D0[7: 0] written to the area of the memory cell array 20 specified by the read address bits [18: 0] as the read data and outputs it in the form of the serial signals SB[3: 0] as shown in FIG. 3.

Next, the detailed operation of the address S/P conversion part 12 will be described.

Figure 4:
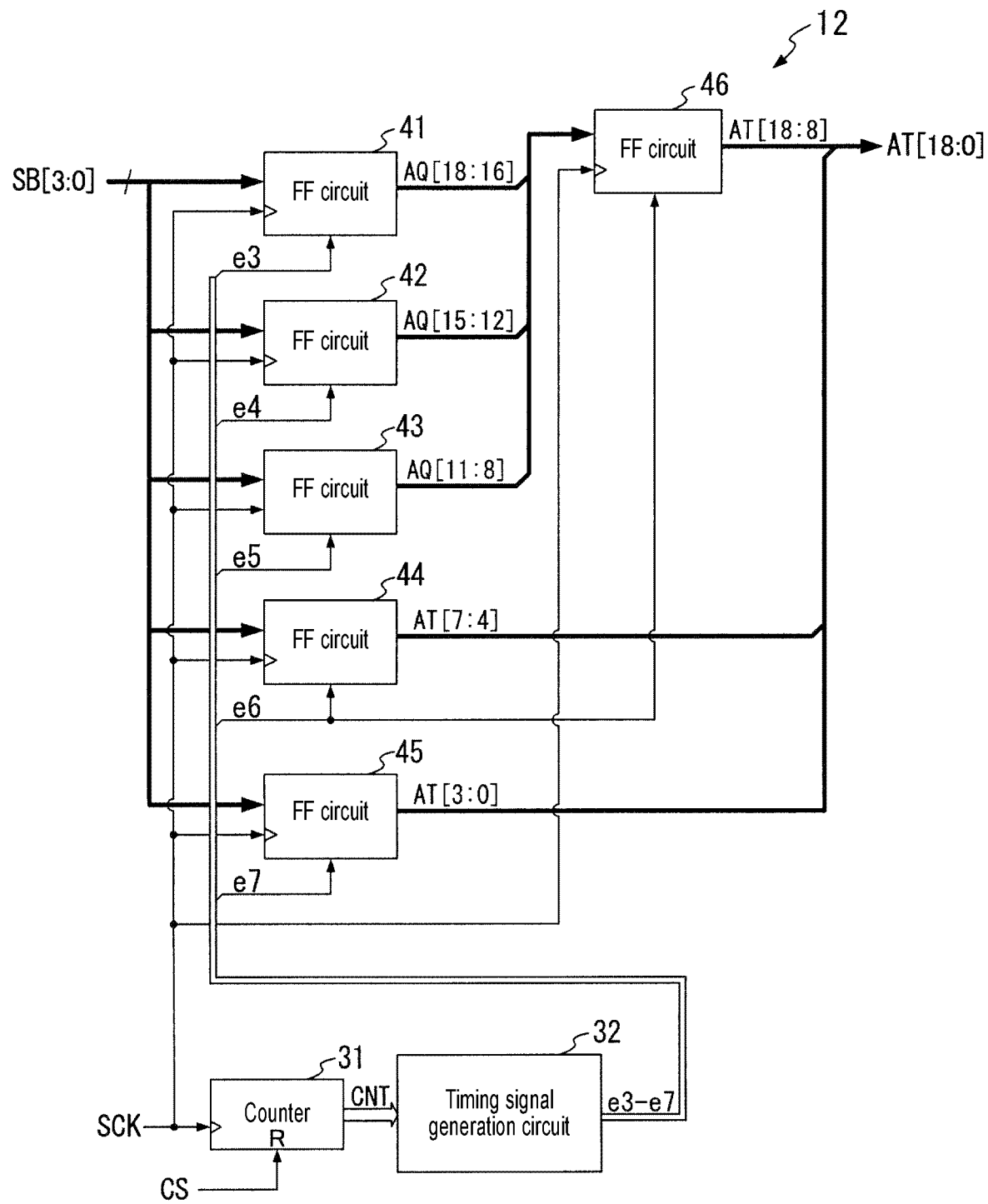
FIG. 4 is a block diagram showing an internal configuration of the address S/P conversion part 12.

FIG. 4 is a block diagram showing an internal configuration of the address S/P conversion part 12.

As shown in FIG. 4, the address S/P conversion part 12 includes a counter 31, a timing signal generation circuit 32, and flip-flops (hereinafter referred to as FF) circuits 41 to 46 each having an enable terminal EN.

The counter 31 counts the number of pulses of a binary (logic levels 0, 1) serial clock signal SCK at the timing of the rising edge of the serial clock signal SCK and supplies count data CNT indicating the count value to the timing signal generation circuit 32. In addition, the cycle of the serial clock signal SCK is equal to 1 bit cycle of the bit string included in each of the serial signals SB[3: 0].

Also, when receiving the chip select signal CS of logic level 1 indicating non-selection via the external terminal of the semiconductor memory 100, the counter 31 resets the count value thereof to the initial value (zero). Moreover, the chip select signal CS maintains the state of logic level 0 indicating that the semiconductor memory 100 is selected as the operating device in the period of performing write access or read access as shown in FIG. 3, and maintains the state of logic level 1 indicating non-selection in other periods.

The timing signal generation circuit 32 generates a timing signal e3, which has logic level 1 indicating the enable state when the count value indicated by the count data CNT indicates "3" and has logic level 0 in the case of other count values, and supplies it to the enable terminal EN of the FF circuit 41. Further, the timing signal generation circuit 32 generates a timing signal e4, which has logic level 1 indicating the enable state when the count value indicated by the count data CNT indicates "4" and has logic level 0 in the case of other count values, and supplies it to the enable terminal EN of the FF circuit 42. Further, the timing signal generation circuit 32 generates a timing signal e5, which has logic level 1 indicating the enable state when the count value indicated by the count data CNT indicates "5" and has logic level 0 in the case of other count values, and supplies it to the enable terminal EN of the FF circuit 43.

Further, the timing signal generation circuit 32 generates a timing signal e6, which has logic level 1 indicating the enable state when the count value indicated by the count data CNT indicates "6" and has logic level 0 in the case of other count values, and supplies it to the enable terminal EN of each of the FF circuits 44 and 46. Further, the timing signal generation circuit 32 generates a timing signal e7, which has logic level 1 indicating the enable state when the count value indicated by the count data CNT indicates "7" and has logic level 0 in the case of other count values, and supplies it to the enable terminal EN of the FF circuit 45.

That is, the timing signal generation circuit 32 generates the timing signals e3 to e7 respectively indicating timings that differ by 1 bit cycle of the bit string included in the serial signals SB[3: 0].

The FF circuit 41 includes three FFs, which individually acquire the bit included in each of the serial signals SB[2], SB[1], and SB[0] at the timing of the rising edge of the serial clock signal SCK and hold it when the timing signal e3 is in the state of logic level 1. The FF circuit 41 supplies the acquired bit included in the serial signal SB[2] as the standby address bit AQ[18], supplies the bit included in SB[1] as the standby address bit AQ[17], and supplies the bit included in SB[0] as the standby address bit AQ[16] to the FF circuit 46.

The FF circuit 42 includes four FFs, which individually acquire the bit included in each of the serial signals SB[3], SB[2], SB[1], and SB[0] at the timing of the rising edge of the serial clock signal SCK and hold it when the timing signal e4 is in the state of logic level 1. The FF circuit 42 supplies the acquired bit included in the serial signal SB[3] as the standby address bit AQ[15], supplies the bit included in SB[2] as the standby address bit AQ[14], supplies the bit included in SB[1] as the standby address bit AQ[13], and supplies the bit included in SB[0] as the standby address bit AQ[12] to the FF circuit 46.

The FF circuit 43 includes four FFs, which individually acquire the bit included in each of the serial signals SB[3], SB[2], SB[1], and SB[0] at the timing of the rising edge of the serial clock signal SCK and hold it when the timing signal e5 is in the state of logic level 1. The FF circuit 43 supplies the acquired bit included in the serial signal SB[3] as the standby address bit AQ[11], supplies the bit included in SB[2] as the standby address bit AQ[10], supplies the bit included in SB[1] as the standby address bit AQ[9], and supplies the bit included in SB[0] as the standby address bit AQ[8] to the FF circuit 46.

The FF circuit 44 includes four FFs, which individually acquire the bit included in each of the serial signals SB[3], SB[2], SB[1], and SB[0] at the timing of the rising edge of the serial clock signal SCK and hold it when the timing signal e6 is in the state of logic level 1. The FF circuit 44 supplies the acquired bit included in the serial signal SB[3] as the memory address AT[7], supplies the bit included in SB[2] as the memory address AT[6], supplies the bit included in SB[1] as the memory address AT[5], and supplies the bit included in SB[0] as the memory address AT[4] to the decoder 15.

The FF circuit 45 includes four FFs, which individually acquire the bit included in each of the serial signals SB[3], SB[2], SB[1], and SB[0] at the timing of the rising edge of the serial clock signal SCK and hold it when the timing signal e7 is in the state of logic level 1. The FF circuit 45 supplies the acquired bit included in the serial signal SB[3] as the memory address AT[3], supplies the bit included in SB[2] as the memory address AT[2], supplies the bit included in SB[1] as the memory address AT[1], and supplies the bit included in SB[0] as the memory address AT[0] to the decoder 15.

The FF circuit 46 includes eleven FFs, which acquire the standby address bit group AQ[18: 8] of 11 bits at the timing of the rising edge of the serial clock signal SCK and hold it when the timing signal e6 is in the state of logic level 1. The FF circuit 46 supplies the acquired standby address bit group AQ[18: 8] as the memory address bit group AT[18: 8] to the decoder 15.

The operation of the semiconductor memory 100 in the case where write access and read access are consecutive will be described below.

Figure 5:
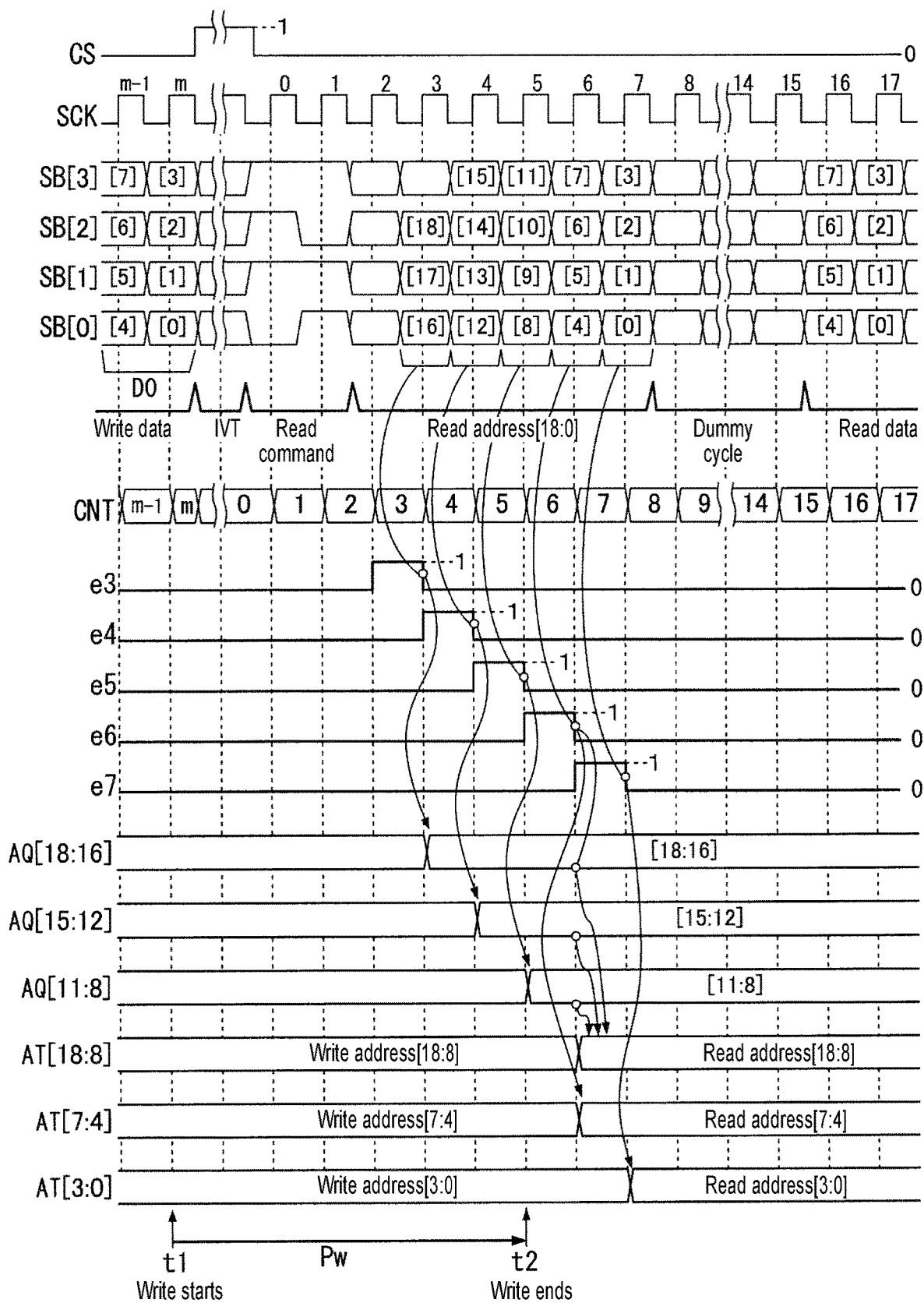
FIG. 5 is a time chart showing an example of the serial signal SB[3: 0] received by the semiconductor memory 100 in a write/read transition period TRP and an internal operation of the address S/P conversion part 12.

FIG. 5 is a time chart showing an example of the serial signals SB[3: 0] received by the semiconductor memory 100 in a write/read transition period TRP shown in FIG. 3 and an internal operation of the address S/P conversion part 12.

First, the semiconductor memory 100 receives the write data D0[7: 0] in the form of the serial signals SB[3: 0] as shown in FIG. 5. At this time, the data S/P conversion part 13 acquires the serial signals SB[3: 0] and supplies the write data D0[7: 0] obtained by converting the serial signals SB[3: 0] into the parallel form to the input data register 16. Meanwhile, the address S/P conversion part 12 continuously supplies the write address bits [18: 0], which have been acquired in the preceding stage and converted into the parallel form, as the memory address bit group AT[18: 0] to the decoder 15 after the time point t1 shown in FIG. 5.

Thus, the write processing of writing the write data D0[7: 0] to the area indicated by the memory address bit group AT[18: 0] of the memory cell array 20 is started from the time point t1 shown in FIG. 5. In the present embodiment, the time required by the memory cell array 20 from the start to the end of the write processing is set to a write processing period Pw corresponding to the length of seven cycles of the serial clock signal SCK as shown in FIG. 5, for example.

When the acquisition of the write data is completed, the semiconductor memory 100 maintains the state of logic level 1 indicating non-selection only in the interval period IVT, and thereafter receives the chip select signal CS which maintains the state of logic level 0 in the period of read access.

Here, the counter 31 included in the address S/P conversion part 12 resets the count value thereof to zero while the chip select signal CS is in the state of logic level 1 indicating non-selection. Thereafter, as shown in FIG. 5, when the chip select signal CS transitions to logic level 0, the counter 31 counts the number of pulses in the serial clock signal SCK one by one. The counter 31 supplies the count data CNT indicating the count value to the timing signal generation circuit 32.

When the interval period IVT ends, the semiconductor memory 100 receives, for example, [11101010] of 8 bits as the read command [7: 0] in the form of the serial signals SB[3: 0] as shown in FIG. 5. At this time, the command S/P conversion part 11 acquires the serial signals SB[3: 0] and supplies the read command [7: 0] obtained by converting the serial signals SB[3: 0] into the parallel form to the controller 14.

Then, following the read command [7: 0], the semiconductor memory 100 receives the 19-bit read address bits [18: 0] in the form of the serial signals SB[3: 0] as shown in FIG. 5. At this time, the address S/P conversion part 12 acquires the serial signals SB[3: 0] and supplies the memory address bit group AT[18: 0] obtained by converting the serial signals SB[3: 0] into the parallel form to the decoder 15.

Specifically, after the end of the interval period IVT, first, as shown in FIG. 5, the read address bits [18: 16] are supplied to the address S/P conversion part 12 in the form of the serial signals SB[2: 0] at the timing of the third pulse of the serial clock signal SCK. Here, the timing signal generation circuit 32 of the address S/P conversion part 12 supplies the timing signal e3 of logic level 1, which indicates the enable state, to the FF circuit 41 only when the count data CNT indicates the count value "3" as shown in FIG. 5.

In response to the timing signal e3 of logic level 1, the FF circuit 41 acquires the read address bits [18: 16] indicated by the serial signals SB[2: 0] at the timing of the rising edge of the third pulse of the serial clock signal SCK. The FF circuit 41 supplies the acquired read address bits [18: 16] as the standby address bits AQ[18: 16] to the FF circuit 46 at the timing of the rising edge of the third pulse of the serial clock signal SCK, as shown in FIG. 5.

Next, at the timing of the fourth pulse of the serial clock signal SCK, the read address bits [15: 12] are supplied in the form of the serial signals SB[3: 0] to the address S/P conversion part 12 as shown in FIG. 5. Here, the timing signal generation circuit 32 of the address S/P conversion part 12 supplies the timing signal e4 of logic level 1, which indicates the enable state, to the FF circuit 42 only when the count data CNT indicates the count value "4" as shown in FIG. 5. In response to the timing signal e4 of logic level 1, the FF circuit 42 acquires the read address bits [15: 12] indicated by the serial signals SB[3: 0] at the timing of the rising edge of the fourth pulse of the serial clock signal SCK. The FF circuit 42 supplies the acquired read address bits [15: 12] as the standby address bits AQ[15: 12] to the FF circuit 46 at the timing of the rising edge of the fourth pulse of the serial clock signal SCK, as shown in FIG. 5.

Next, at the timing of the fifth pulse of the serial clock signal SCK, the read address bits [11: 8] are supplied in the form of the serial signals SB[3: 0] to the address S/P conversion part 12 as shown in FIG. 5. Here, the timing signal generation circuit 32 of the address S/P conversion part 12 supplies the timing signal e5 of logic level 1, which indicates the enable state, to the FF circuit 43 only when the count data CNT indicates the count value "5" as shown in FIG. 5. In response to the timing signal e5 of logic level 1, the FF circuit 43 acquires the read address bits [11: 8] indicated by the serial signals SB[3: 0] at the timing of the rising edge of the fifth pulse of the serial clock signal SCK. The FF circuit 43 supplies the acquired read address bits [11: 8] as the standby address bits AQ[11: 8] to the FF circuit 46 at the timing of the rising edge of the fifth pulse of the serial clock signal SCK, as shown in FIG. 5.

Next, at the timing of the sixth pulse of the serial clock signal SCK, the read address bits [7: 4] are supplied in the form of the serial signals SB[3: 0] to the address S/P conversion part 12 as shown in FIG. 5. Here, the timing signal generation circuit 32 of the address S/P conversion part 12 supplies the timing signal e6 of logic level 1, which indicates the enable state, to the FF circuits 44 and 46 only when the count data CNT indicates the count value "6" as shown in FIG. 5. In response to the timing signal e6 of logic level 1, the FF circuit 44 acquires the read address bits [7: 4] indicated by the serial signals SB[3: 0] at the timing of the rising edge of the sixth pulse of the serial clock signal SCK. The FF circuit 44 supplies the acquired read address bits [7: 4] as the memory address bits AT[7: 4] to the decoder 15.

In addition, in response to the timing signal e6 of logic level 1, the FF circuit 46 acquires the standby address bit group AQ[18: 8] supplied from the FF circuits 41 to 43 as described above at the timing of the rising edge of the sixth pulse of the serial clock signal SCK. Then, the FF circuit 46 supplies the acquired standby address bit group AQ[18: 8] as the memory address bit group AT[18: 8] to the decoder 15.

Next, at the timing of the seventh pulse of the serial clock signal SCK, the read address bits [3: 0] are supplied in the form of the serial signals SB[3: 0] to the address S/P conversion part 12 as shown in FIG. 5. Here, the timing signal generation circuit 32 of the address S/P conversion part 12 supplies the timing signal e7 of logic level 1, which indicates the enable state, to the FF circuit 45 only when the count data CNT indicates the count value "7" as shown in FIG. 5. In response to the timing signal e7 of logic level 1, the FF circuit 45 acquires the read address bits [3: 0] indicated by the serial signals SB[3: 0] at the timing of the rising edge of the seventh pulse of the serial clock signal SCK. The FF circuit 45 supplies the acquired read address bits [3: 0] as the memory address bits AT[3: 0] to the decoder 15.

As described above, the address S/P conversion part 12 first supplies the memory address bit group AT[18: 4], which is obtained by converting the read address bits [18: 4] received in the form of the serial signals [3: 0] into the parallel form, to the decoder 15 at the timing of the sixth pulse of the serial clock signal SCK as shown in FIG. 5. Thus, as shown in FIG. 5, at the timing of the sixth pulse of the serial clock signal SCK, the contents indicated by AT[18: 4] in the memory address bit group AT[18: 0] are switched from a write address to a read address.

In addition, the address S/P conversion part 12 supplies the memory address bit group AT[3: 0], which is obtained by converting the read address bits [3: 0] received in the form of the serial signals [3: 0] into the parallel form, to the decoder 15 at the timing of the seventh pulse of the serial clock signal SCK as shown in FIG. 5. Thus, as shown in FIG. 5, at the timing of the seventh pulse of the serial clock signal SCK, the contents indicated by AT[3: 0] in the memory address bit group AT[18: 0] are switched from a write address to a read address.

Here, as shown in FIG. 5, the address S/P conversion part 12 receives [7: 4] and [3: 0] in the read address bits [18: 0] indicated in the form of the serial signals SB[3: 0] at the timing that is after the write processing period Pw. Therefore, the timing at which the contents of the memory address bit group AT[7: 0] are switched from the write address to the read address comes after the above-described write processing period Pw. Therefore, at this time, the problem that the contents of the memory address bit group AT[7: 0] to be supplied to the decoder 15 are switched to the read address in the write processing period Pw does not occur.

On the other hand, in regard to [18: 16], [15: 12], and [11: 8] in the read address bits [18: 0] received in the form of the serial signals SB[3: 0], the address S/P conversion part 12 receives them in the write processing period Pw. Therefore, if the contents of the memory address bit groups AT[18: 16], [15: 12], and [11: 8] are switched from the write address to the read address at the timings they are received, the read address will be supplied to the decoder 15 in the write processing period Pw, causing a problem in writing.

Thus, in the address S/P conversion part 12, the read address bits [18: 16], [15: 12], and [11: 8] received in the form of the serial signals SB[3: 0] in the write processing period Pw are temporarily acquired by the FF circuits 41 to 43, which serve as the first conversion part, at the timings they are received, and are kept on standby.

In other words, in regard to the read address bits [18: 16], the FF circuit 41 acquires the read address bits [18: 16] at the timing of receiving them (the timing of the third pulse of the serial clock signal SCK) and keeps them on standby as the standby address bit group AQ[18: 16]. Moreover, in regard to the read address bits [15: 12], the FF circuit 42 acquires the read address bits [15: 12] at the time of receiving them (the timing of the fourth pulse of the serial clock signal SCK) and keeps them on standby as the standby address bit group AQ[15: 12]. Further, in regard to the read address bits [11: 8], the FF circuit 43 acquires the read address bits [11: 8] at the time of receiving them (the timing of the fifth pulse of the serial clock signal SCK) and keeps them on standby as the standby address bit group AQ[11: 8].

Then, the FF circuit 46, which serves as the standby output part, acquires the above-described standby address bit group AQ[18: 8] together at the timing of the sixth pulse of the serial clock signal SCK, which is the timing immediately after the write processing period Pw, and supplies them to the decoder 15 as the memory address bit group AT[18: 8].

Furthermore, in the address S/P conversion part 12, in regard to the read address bits [7: 4] and [3: 0] received in the form of the serial signals SB[3: 0], the FF circuits 44 and 45, which serve as the second conversion part, acquire the read address bits [7: 4] and [3: 0] at the timing of receiving them and supply them to the decoder 15 as the memory address bit group AT[7: 0].

The above operation prevents the problem that the contents of the memory address bit group AT are switched from the write address to the read address in the write processing period Pw.

Therefore, according to the address S/P conversion part 12, as shown in FIG. 5, it is possible to solve the above-described problem without increasing the interval period IVT, which is provided in the shifting from write access to read access, by the write processing period Pw.

Accordingly, as shown in FIG. 5, it is possible to receive the read address bits [18: 0] in the form of the serial signals SB[3: 0] in the write processing period Pw. Thus, it is possible to transition from the state of write access to read access quickly as compared with the case of waiting for the end of the write processing period Pw and then receiving the read commands [7: 0] and the read address bits [18: 0] in the form of the serial signals SB[3: 0] in order.

Moreover, in the address S/P conversion part 12, the timing signal e6 is used in order to send the standby address bit group AQ[18: 8], which is acquired and kept on standby by the FF circuits 41 to 43, as the memory address bit group AT[18: 8] to the decoder 15 after the write processing period Pw elapses. As described above, the timing signal e6 is a signal used for the FF circuit 44 to acquire the read data [7: 4] received in the form of the serial signals SB[3: 0]. At this time, the timing at which the FF circuit 44 acquires the read data [7: 4] with the timing signal e6 is later than the end time point t2 of the write processing period Pw shown in FIG. 5.

Since it is not required to generate a new timing signal for sending the standby address bit group AQ[18: 8] as the memory address bit group AT[18: 8] to the decoder 15 at the timing later than the end time point t2 of the write processing period Pw, it is possible to prevent increasing the device scale.

Although the above embodiment illustrates that the data capacity of the semiconductor memory 100 is 4 Mbit and the number of addresses during access is 19 bits, the data capacity and the number of addresses are not limited thereto.

In the above embodiment, a memory that conforms to Quad SPI is adopted as the semiconductor memory 100, but the disclosure is not limited thereto. DUAL SPI, in which the main lines of the serial signals are two SPI, one SPI, or other high-speed data transfer technology may also be applied.

Further, in the above embodiment, the FF circuit having an enable terminal is adopted as a holding circuit that acquires and holds a bit string, such as a write or read command, a write or read address, or a write data, in the form of serial signals in the address S/P conversion part 12. However, it is also possible to adopt a configuration, which adopts a FF circuit having no enable terminal and has a logic circuit provided in a preceding stage of the FF circuit for receiving data input or clock input to the FF circuit according to the timing signal.

In addition, in the address S/P conversion part 12 shown in FIG. 4, the five-system FF circuits 41 to 45 are adopted as the FF circuits for acquiring and holding the serial signals SB, but the number of the FF circuits is not necessarily five. Besides, in the configuration shown in FIG. 4, the outputs of three FF circuits 41 to 43 among the FF circuits 41 to 45 are set as the standby address bit group AQ, but the number of the FF circuits that serve as the first conversion part for outputting the standby address bit group AQ is not necessarily three. Similarly, in the configuration shown in FIG. 4, two FF circuits 44 and 45 among the FF circuits 41 to 45 serve as the second conversion part, but the number of the FF circuits included in the second conversion part is not necessarily two.

Furthermore, in the configuration shown in FIG. 4, the serial signals SB are acquired, held, and outputted by the FF circuits 41 to 45 that operate in synchronization with the serial clock signal SCK. However, it is possible to adopt not only the FF circuits but also latch circuits to serve as the holding circuits for acquiring, holding, and outputting such serial signals SB.

In the address S/P conversion part 12 shown in FIG. 4, the FF circuit 46 acquires the standby address bit group AQ[18: 8] and outputs it as the memory address bit group AT[18: 8] at the timing e6 of the timing signals e3 to e7. However, it is also possible to acquire and output the standby address bit group AQ[18: 8] in the FF circuit 46 at the timing of the timing signal e7 that indicates a timing later than the timing signal e6.

In other words, the FF circuit 46 that serves as the standby output part is only required to acquire and output the standby address bit group according to the timing signal, which indicates a timing later than the end time point t2 of the write processing period Pw as shown in FIG. 5, among the timing signals e3 to e7.

Further, in the embodiments shown in FIG. 3 and FIG. 5, the problem due to switching from the write address to the read address in the write processing period, which occurs at the time of transition from the write access to the read access in the semiconductor memory 100, is avoided. However, the processing to be performed consecutively (referred to as pre-processing and post-processing) may be processing other than the write access and the read access. For example, in a system that receives a first bit string in the serial form to execute pre-processing using the first bit string and subsequently receives a second bit string in the serial form to execute post-processing using the second bit string, a serial interface circuit having the same configuration as the address S/P conversion part 12 is adopted. Thus, even if the second bit string in the serial form to be used in post-processing is received during execution of pre-processing using the first bit string, it is possible to avoid the problem that the first bit string is switched to the second bit string during execution of pre-processing.

In short, as the serial interface circuit (12) that receives the serial signal (SB) including the bit string in the serial form and converts the bit string included in the serial signal into the parallel form to obtain the parallel bit group (AT[18: 0]), a circuit that includes the following timing signal generation part, first and second conversion parts, and standby output part may be adopted.

That is, the timing signal generation part (31, 32) generates the first to $n^{th}$ (n is an integer equal to or greater than 2) timing signals (e3 to e7) respectively indicating timings that differ by 1 bit cycle of a bit string. The first conversion part (41 to 43) holds each bit in the bit string included in the serial signal at timings of the first to $t^{th}$ (t is an integer less than n) timing signals (e3 to e5) among the first to $n^{th}$ timing signals and outputs the held bit group as the standby bit group (AQ). The standby output part (46) acquires the standby bit group (AQ) at the timing of any one timing signal (e6) of the $(t+1)^{th}$ to $n^{th}$ timing signals (e6, e7) among the first to $n^{th}$ timing signals and outputs the acquired standby bit group as a part (AT[18: 8]) of the parallel bit group. The second conversion part holds each bit in the bit string included in the serial signal at the timings of the $(t+1)^{th}$ to $n^{th}$ timing signals (e6, e7) and outputs the held bit group as another part (AT[7: 0]) of the parallel bit group.

What is claimed is:

1. A serial interface circuit receiving a serial signal, which includes a bit string in a serial form, and converting the bit string included in the serial signal into a parallel form to obtain a parallel bit group, the serial interface circuit comprising:

a timing signal generation part generating first to $n^{th}$ timing signals respectively indicating timings that differ by 1 bit cycle of the bit string, wherein n is an integer equal to or greater than 2;

a first conversion part holding each bit in the bit string included in the serial signal at timings of first to $t^{th}$ timing signals among the first to $n^{th}$ timing signals and outputting a held bit group as a standby bit group, wherein t is an integer less than n;

a standby output part acquiring the standby bit group at a timing of any one of $(t+1)^{th}$ to $n^{th}$ timing signals among the first to $n^{th}$ timing signals and outputting the acquired standby bit group as a part of the parallel bit group; and a second conversion part holding each bit in the bit string included in the serial signal at timings of the $(t+1)^{th}$ to $n^{th}$ timing signals and outputting a held bit group as an other part of the parallel bit group.

2. The serial interface circuit according to claim 1, wherein the first conversion part comprises first to $t^{th}$ flip-flop circuits that receive the corresponding timing signals among the first to $t^{th}$ timing signals by respective enable terminals, acquire each bit included in the serial signal according to the timing signals received by the enable terminals, and output each bit while holding each bit, the second conversion part comprises $(t+1)^{th}$ to $n^{th}$ flip-flop circuits that receive the corresponding timing signals among the $(t+1)^{th}$ to $n^{th}$ timing signals by respective enable terminals, acquire each bit included in the serial signal according to the timing signals received by the enable terminals, and output each bit while holding each bit, and the standby output part comprises a flip-flop circuit that receives any one of the $(t+1)^{th}$ to $n^{th}$ timing signals by an enable terminal of the flip-flop circuit, acquires the standby bit group according to the timing signal received by the enable terminal, and outputs the standby bit group.

3. The serial interface circuit according to claim 1, wherein the timing signal generation part comprises a counter that receives a clock signal having 1 bit cycle of the bit string and outputs a count value obtained by counting a number of pulses of the clock signal, and the timing signal generation part generates the first to $n^{th}$ timing signals based on the count value.

4. A semiconductor device, comprising:

a memory cell array comprising a plurality of memory cells;

an address serial-parallel conversion part receiving a serial signal, which includes a bit string of an address in a serial form, and converting the bit string of the address included in the serial signal into a parallel form to obtain a memory address; and a decoder supplying a drive voltage to the memory cell specified by the memory address, wherein the address serial-parallel conversion part comprises:

a timing signal generation part generating first to $n^{th}$ timing signals respectively indicating timings that differ by 1 bit cycle of the bit string, wherein n is an integer equal to or greater than 2;

a first conversion part holding each bit in the bit string included in the serial signal at timings of the first to $t^{th}$ timing signals among the first to $n^{th}$ timing signals and outputting a held bit group as a standby address bit group, wherein t is an integer less than n;

a standby output part acquiring the standby address bit group at a timing of any one of $(t+1)^{th}$ to $n^{th}$ timing signals among the first to $n^{th}$ timing signals and outputting the acquired standby address bit group as a part of the memory address; and a second conversion part holding each bit in the bit string included in the serial signal at timings of the $(t+1)^{th}$ to $n^{th}$ timing signals and outputting a held bit group as an other part of the memory address.

5. The semiconductor device according to claim 4, wherein the serial signal, which includes the bit string of the address, is received in a write processing period for the memory cell, and the standby output part acquires the standby address bit group at the timing of the one timing signal, which indicates the timing after an end time point of the write processing period, among the $(t+1)^{th}$ to $n^{th}$ timing signals.

6. A serial-parallel conversion method for receiving a serial signal, which includes a bit string in a serial form, and converting the bit string included in the serial signal into a parallel form to obtain a parallel bit group, the serial-parallel conversion method comprising:

generating first to $n^{th}$ timing signals respectively indicating timings that differ by 1 bit cycle of the bit string, wherein n is an integer equal to or greater than 2;

holding each bit in the bit string included in the serial signal at timings of the first to $t^{th}$ timing signals among the first to $n^{th}$ timing signals and outputting a held bit group as a standby bit group, wherein t is an integer less than n;

acquiring the standby bit group at a timing of any one of $(t+1)^{th}$ to $n^{th}$ timing signals among the first to $n^{th}$ timing signals and outputting the acquired standby bit group as a part of the parallel bit group; and holding each bit in the bit string included in the serial signal at timings of the $(t+1)^{th}$ to $n^{th}$ timing signals and outputting a held bit group as an other part of the parallel bit group.

* * * * *